United States Patent
Muto et al.

(10) Patent No.: US 7,876,173 B2
(45) Date of Patent: Jan. 25, 2011

(54) SIGNAL OUTPUT DEVICE, SIGNAL OUTPUT CONTROL METHOD, PROGRAM AND RECORDING MEDIUM

(75) Inventors: Masahiko Muto, Saitama (JP); Kiyoshi Hashiba, Saitama (JP); Takashi Kusaka, Gunma (JP)

(73) Assignee: Advantest Corporation, Tokyo (JP)

( * ) Notice: Subject to any disclaimer, the term of this patent is extended or adjusted under 35 U.S.C. 154(b) by 257 days.

(21) Appl. No.: 12/201,283

(22) Filed: Aug. 29, 2008

(65) Prior Publication Data

US 2009/0322451 A1 Dec. 31, 2009

(30) Foreign Application Priority Data

Jun. 30, 2008 (JP) .............................. 2008-171002

(51) Int. Cl.
*G01R 35/00* (2006.01)
(52) U.S. Cl. .................................. 333/81 R; 324/76.13
(58) Field of Classification Search ................ 333/17.3, 333/81 R; 324/76.13, 76.19
See application file for complete search history.

(56) References Cited

U.S. PATENT DOCUMENTS

| 6,094,055 | A * | 7/2000 | Dosdall et al. .............. 324/601 |
| 2007/0143051 | A1 | 6/2007 | Nakayama et al. |
| 2008/0018322 | A1 | 1/2008 | Kurosawa et al. |
| 2008/0054880 | A1 | 3/2008 | Miyauchi et al. |

(Continued)

FOREIGN PATENT DOCUMENTS

JP 5-198092 8/1993

(Continued)

OTHER PUBLICATIONS

English language Abstract of JP 2002-353756, Dec. 6, 2002.

(Continued)

*Primary Examiner*—Stephen E Jones
(74) *Attorney, Agent, or Firm*—Greenblum & Bernstein P.L.C.

(57) ABSTRACT

The present invention can control the power of an output from a device, which changes the amplitude of an input and outputs a result of the change, according to the frequency of the input so that the power is close to a desired value. An output control system (1) includes an amplitude changer (2) which controls the ratio of a change in amplitude according to a control signal, a discrete attenuator (14) which outputs an output signal obtained by attenuating an output from the amplitude changer while discretely setting an amount of the attenuation, a measurement result changer (18) which changes a measurement result of the output signal, a set voltage recording unit (24) which records a correspondence between a value of the control signal and a value of the output signal when the input signal is at a predetermined frequency, a measurement result correcting unit (44) which corrects an output from the measurement result changer (18) according to the frequency of the input signal, a target value correcting unit (42) which corrects a target value of the output signal according to the frequency of the input signal, a voltage setting unit (26) which sets the value of the control signal, an attenuation setting unit (12) which sets the amount of the attenuation according to the frequency of the input signal and a change setting unit (13) which sets an amount of the change provided by the measurement result changer (18).

14 Claims, 10 Drawing Sheets

U.S. PATENT DOCUMENTS

2008/0231850 A1    9/2008    Yamashita et al.
2008/0252644 A1    10/2008    Fujii

FOREIGN PATENT DOCUMENTS

| | | |
|---|---|---|
| JP | 5-35608 | 9/1993 |
| JP | 11-154839 | 6/1999 |
| JP | 11-284457 | 10/1999 |
| JP | 2000-278063 | 10/2000 |
| JP | 2002-353756 | 12/2002 |

OTHER PUBLICATIONS

English language Abstract of JP 11-284457, Oct. 15, 1999.
English language Abstract of JP 2000-278063, Oct. 6, 2000.
English language Abstract of JP 5-198092, Aug. 6, 1993.
English language Abstract of JP 11-154839, Jun. 8, 1999.

\* cited by examiner

SIGNAL OUTPUT DEVICE, SIGNAL OUTPUT CONTROL METHOD, PROGRAM AND RECORDING MEDIUM

BACKGROUND OF THE INVENTION

1. Technical Field

The present invention relates to adjustment of a power of a signal.

2. Background Art

Conventionally, there has been known a device which amplifies a signal by means of a variable-gain amplifier, outputs the amplified signal, detects the output by peak detection, processes the detected signal by means of a digital circuit (refer to FIG. 1 and ABSTRACT of Patent Document 1), and controls the gain of the variable-gain amplifier based on a processing result, thereby controlling the power of the output of the variable-gain amplifier.

(Patent Document 1)

Japanese Laid-Open Patent Publication No. H11-154839

DISCLOSURE OF THE INVENTION

The frequency of the signal fed to the variable-gain amplifier may take various values (namely more than two values).

This happens not only in a case in which a signal is amplified by a variable-gain amplifier but also in a case in which a signal is attenuated by an attenuator.

It is therefore an object of the present invention to control the power of an output from a device, which changes the amplitude of an input and outputs a result of the change, according to the frequency of the input so that the power is close to a desired value.

According to the present invention, a signal output device includes: an amplitude changer that changes an amplitude of an input signal, and controls a ratio of a change of the amplitude based on a control signal; a discrete attenuator that outputs an output signal obtained by attenuating an output from the amplitude changer while discretely setting an amount of the attenuation; a measurement result changer that changes a measurement result of the output signal; a control signal setting unit that sets the control signal based on an output from the measurement result changer and a target value of the output signal; an attenuation setting unit that sets the amount of the attenuation according to the frequency of the input signal; and a change setting unit that sets an amount of the change provided by the measurement result changer based on a difference between an ideal amount of the attenuation which is the amount of the attenuation proper for the output signal to be close to the target value and the amount of the attenuation set by the discrete attenuator.

According to the thus constructed signal output device, an amplitude changer changes an amplitude of an input signal, and controls a ratio of a change of the amplitude based on a control signal. A discrete attenuator outputs an output signal obtained by attenuating an output from the amplitude changer while discretely setting an amount of the attenuation. A measurement result changer changes a measurement result of the output signal. A control signal setting unit sets the control signal based on an output from the measurement result changer and a target value of the output signal. An attenuation setting unit sets the amount of the attenuation according to the frequency of the input signal. A change setting unit sets an amount of the change provided by the measurement result changer based on a difference between an ideal amount of the attenuation which is the amount of the attenuation proper for the output signal to be close to the target value and the amount of the attenuation set by the discrete attenuator.

According to the present invention, the amount of the attenuation which can be set to the discrete attenuator may be constant within a predetermined range of the frequency of the input signal.

According to the present invention, a difference between an approximated ideal amount of the attenuation which approximates the ideal amount of the attenuation and the amount of the attenuation set to the discrete attenuator may be set to the amount of the change while it is assumed that the ideal amount of the attenuation varies in proportion to a change in the frequency of the input signal within a predetermined range of the frequency of the input signal.

According to the present invention, a signal output device includes: an amplitude changer that changes an amplitude of an input signal, and controls a ratio of a change of the amplitude based on a control signal; an attenuator that outputs an output signal obtained by attenuating an output from the amplitude changer; a correspondence recording unit that records a predetermined correspondence which is a correspondence between the value of the control signal and the value of the output signal when the input signal is at a predetermined frequency; a target value correcting unit that corrects a target value of the output signal to a value of the output signal corresponding, in the predetermined correspondence, to a value of the control signal which brings the output signal to the target value according to the frequency of the input signal; and a control signal setting unit that reads a value of the control signal corresponding, in the predetermined correspondence, to an output of the target value correcting unit from the correspondence recording unit, and sets the read value of the control signal to the value of the control signal.

According to the thus constructed signal output device, an amplitude changer changes an amplitude of an input signal, and controls a ratio of a change of the amplitude based on a control signal. An attenuator outputs an output signal obtained by attenuating an output from the amplitude changer. A correspondence recording unit records a predetermined correspondence which is a correspondence between the value of the control signal and the value of the output signal when the input signal is at a predetermined frequency. A target value correcting unit corrects a target value of the output signal to a value of the output signal corresponding, in the predetermined correspondence, to a value of the control signal which brings the output signal to the target value according to the frequency of the input signal. A control signal setting unit reads a value of the control signal corresponding, in the predetermined correspondence, to an output of the target value correcting unit from the correspondence recording unit, and sets the read value of the control signal to the value of the control signal.

According to the present invention, the signal output device may include a measurement result correcting unit that corrects a measurement result of the output signal to a value of the output signal corresponding, in the predetermined correspondence, to a value of the control signal which brings the output signal to the measurement result according to the frequency of the input signal, wherein the control signal setting unit reads a value of the control signal corresponding, in the predetermined correspondence, to a sum of a difference between the output from the target value correcting unit and an output from the measurement result correcting unit, and the output from the target value correcting unit from the correspondence recording unit after the output signal is measured, and sets the read value of the control signal to the value of the control signal.

According to the present invention, the target value correcting unit may correct the target value based on a difference between the predetermined correspondence and a correspondence between the value of the control signal and the value of the output signal when the input signal is not at the predetermined frequency.

According to the present invention, the measurement result correcting unit may correct the measurement result based on a difference between the predetermined correspondence and a correspondence between the value of the control signal and the value of the output signal when the input signal is not at the predetermined frequency.

According to the present invention, a signal output device includes: an amplitude changer that changes an amplitude of an input signal, and controls a ratio of a change of the amplitude based on a control signal; a discrete attenuator that outputs an output signal obtained by attenuating an output from the amplitude changer while discretely setting an amount of the attenuation; a measurement result changer that changes a measurement result of the output signal; a correspondence recording unit that records a predetermined correspondence which is a correspondence between the value of the control signal and the value of the output signal when the input signal is at a predetermined frequency; a measurement result correcting unit that corrects a measurement result of the output signal changed by the measurement result changer to a value of the output signal corresponding, in the predetermined correspondence, to a value of the control signal which brings the output signal to the changed measurement result according to the frequency of the input signal; a target value correcting unit that corrects a target value of the output signal to a value of the output signal corresponding, in the predetermined correspondence, to a value of the control signal which brings the output signal to the target value according to the frequency of the input signal; a control signal setting unit that reads the value of the control signal corresponding, in the predetermined correspondence, to a sum of a difference between an output from the target value correcting unit and the output from the measurement result correcting unit, and the output from the target value correcting unit from the correspondence recording unit, and sets the read value of the control signal to the value of the control signal; an attenuation setting unit that sets the amount of the attenuation according to the frequency of the input signal; and a change setting unit that sets an amount of the change provided by the measurement result changer based on a difference between an ideal amount of the attenuation which is the amount of the attenuation proper for the output signal to be close to the target value and the amount of the attenuation set by the discrete attenuator.

According to the thus constructed invention, an amplitude changer changes an amplitude of an input signal, and controls a ratio of a change of the amplitude based on a control signal. A discrete attenuator outputs an output signal obtained by attenuating an output from the amplitude changer while discretely setting an amount of the attenuation. A measurement result changer changes a measurement result of the output signal. A correspondence recording unit records a predetermined correspondence which is a correspondence between the value of the control signal and the value of the output signal when the input signal is at a predetermined frequency. A measurement result correcting unit corrects a measurement result of the output signal changed by the measurement result changer to a value of the output signal corresponding, in the predetermined correspondence, to a value of the control signal which brings the output signal to the changed measurement result according to the frequency of the input signal. A target value correcting unit corrects a target value of the output signal to a value of the output signal corresponding, in the predetermined correspondence, to a value of the control signal which brings the output signal to the target value according to the frequency of the input signal. A control signal setting unit reads the value of the control signal corresponding, in the predetermined correspondence, to a sum of a difference between an output from the target value correcting unit and the output from the measurement result correcting unit, and the output from the target value correcting unit from the correspondence recording unit, and sets the read value of the control signal to the value of the control signal. An attenuation setting unit sets the amount of the attenuation according to the frequency of the input signal. A change setting unit sets an amount of the change provided by the measurement result changer based on a difference between an ideal amount of the attenuation which is the amount of the attenuation proper for the output signal to be close to the target value and the amount of the attenuation set by the discrete attenuator.

The present invention is a signal output control method of a signal output device having an amplitude changer that changes an amplitude of an input signal, and controls a ratio of a change of the amplitude based on a control signal; and a discrete attenuator that outputs an output signal obtained by attenuating an output from the amplitude changer while discretely setting an amount of the attenuation, the signal output control method including: a measurement result changing step that changes a measurement result of the output signal; a control signal setting step that sets the control signal based on an output from the measurement result changing step and a target value of the output signal; an attenuation setting step that sets the amount of the attenuation according to the frequency of the input signal; and a change setting step that sets an amount of the change provided by the measurement result changing step based on a difference between an ideal amount of the attenuation which is the amount of the attenuation proper for the output signal to be close to the target value and the amount of the attenuation set by the discrete attenuator.

The present invention is a signal output control method of a signal output device having: an amplitude changer that changes an amplitude of an input signal, and controls a ratio of a change of the amplitude based on a control signal; and an attenuator that outputs an output signal obtained by attenuating an output from the amplitude changer, the signal output control method including: a correspondence recording step that records a predetermined correspondence which is a correspondence between the value of the control signal and the value of the output signal when the input signal is at a predetermined frequency; a target value correcting step that corrects a target value of the output signal to a value of the output signal corresponding, in the predetermined correspondence, to a value of the control signal which brings the output signal to the target value according to the frequency of the input signal; and a control signal setting step that reads a value of the control signal corresponding, in the predetermined correspondence, to an output of the target value correcting step from the correspondence recording step, and sets the read value of the control signal to the value of the control signal.

The present invention is a signal output control method of a signal output device having: an amplitude changer that changes an amplitude of an input signal, and controls a ratio of a change of the amplitude based on a control signal; and a discrete attenuator that outputs an output signal obtained by attenuating an output from the amplitude changer while discretely setting an amount of the attenuation, the signal output control method including: a measurement result changing step that changes a measurement result of the output signal; a correspondence recording step that records a predetermined correspondence which is a correspondence between the value of the control signal and the value of the output signal when the input signal is at a predetermined frequency; a measurement result correcting step that corrects a measurement result of the output signal changed by the measurement result changing step to a value of the output signal corresponding, in the predetermined correspondence, to a value of the control signal which brings the output signal to the changed measurement result according to the frequency of the input signal; a target value correcting step that corrects a target value of the output signal to a value of the output signal corresponding, in the predetermined correspondence, to a value of the control signal which brings the output signal to the target value according to the frequency of the input signal; a control signal setting step that reads the value of the control signal corresponding, in the predetermined correspondence, to a sum of a difference between an output from the target value correcting step and the output from the measurement result correcting step, and the output from the target value correcting step from the correspondence recording step, and sets the read value of the control signal to the value of the control signal; an attenuation setting step that sets the amount of the attenuation according to the frequency of the input signal; and a change setting step that sets an amount of the change provided by the measurement result changing step based on a difference between an ideal amount of the attenuation which is the amount of the attenuation proper for the output signal to be close to the target value and the amount of the attenuation set by the discrete attenuator.

The present invention is a program of instructions for execution by the computer to perform a signal output control process of a signal output device having an amplitude changer that changes an amplitude of an input signal, and controls a ratio of a change of the amplitude based on a control signal; and a discrete attenuator that outputs an output signal obtained by attenuating an output from the amplitude changer while discretely setting an amount of the attenuation, the signal output control process including: a measurement result changing step that changes a measurement result of the output signal; a control signal setting step that sets the control signal based on an output from the measurement result changing step and a target value of the output signal; an attenuation setting step that sets the amount of the attenuation according to the frequency of the input signal; and a change setting step that sets an amount of the change provided by the measurement result changing step based on a difference between an ideal amount of the attenuation which is the amount of the attenuation proper for the output signal to be close to the target value and the amount of the attenuation set by the discrete attenuator.

The present invention is a program of instructions for execution by the computer to perform a signal output control process of a signal output device having: an amplitude changer that changes an amplitude of an input signal, and controls a ratio of a change of the amplitude based on a control signal; and an attenuator that outputs an output signal obtained by attenuating an output from the amplitude changer, the signal output control process including: a correspondence recording step that records a predetermined correspondence which is a correspondence between the value of the control signal and the value of the output signal when the input signal is at a predetermined frequency; a target value correcting step that corrects a target value of the output signal to a value of the output signal corresponding, in the predetermined correspondence, to a value of the control signal which brings the output signal to the target value according to the frequency of the input signal; and a control signal setting step that reads a value of the control signal corresponding, in the predetermined correspondence, to an output of the target value correcting step from the correspondence recording step, and sets the read value of the control signal to the value of the control signal.

The present invention is a program of instructions for execution by the computer to perform a signal output control process of a signal output device having: an amplitude changer that changes an amplitude of an input signal, and controls a ratio of a change of the amplitude based on a control signal; and a discrete attenuator that outputs an output signal obtained by attenuating an output from the amplitude changer while discretely setting an amount of the attenuation, the signal output control process including: a measurement result changing step that changes a measurement result of the output signal; a correspondence recording step that records a predetermined correspondence which is a correspondence between the value of the control signal and the value of the output signal when the input signal is at a predetermined frequency; a measurement result correcting step that corrects a measurement result of the output signal changed by the measurement result changing step to a value of the output signal corresponding, in the predetermined correspondence, to a value of the control signal which brings the output signal to the changed measurement result according to the frequency of the input signal; a target value correcting step that corrects a target value of the output signal to a value of the output signal corresponding, in the predetermined correspondence, to a value of the control signal which brings the output signal to the target value according to the frequency of the input signal; a control signal setting step that reads the value of the control signal corresponding, in the predetermined correspondence, to a sum of a difference between an output from the target value correcting step and the output from the measurement result correcting step, and the output from the target value correcting step from the correspondence recording step, and sets the read value of the control signal to the value of the control signal; an attenuation setting step that sets the amount of the attenuation according to the frequency of the input signal; and a change setting step that sets an amount of the change provided by the measurement result changing step based on a difference between an ideal amount of the attenuation which is the amount of the attenuation proper for the output signal to be close to the target value and the amount of the attenuation set by the discrete attenuator.

The present invention is a computer-readable medium having a program of instructions for execution by the computer to perform a signal output control process of a signal output device having an amplitude changer that changes an amplitude of an input signal, and controls a ratio of a change of the amplitude based on a control signal; and a discrete attenuator that outputs an output signal obtained by attenuating an output from the amplitude changer while discretely setting an amount of the attenuation, the signal output control process including: a measurement result changing step that changes a measurement result of the output signal; a control signal setting step that sets the control signal based on an output from the measurement result changing step and a target value of the output signal; an attenuation setting step that sets the amount of the attenuation according to the frequency of the input signal; and a change setting step that sets an amount of the change provided by the measurement result changing step based on a difference between an ideal amount of the attenuation which is the amount of the attenuation proper for the output signal to be close to the target value and the amount of the attenuation set by the discrete attenuator.

The present invention is a computer-readable medium having a program of instructions for execution by the computer to perform a signal output control process of a signal output device having: an amplitude changer that changes an amplitude of an input signal, and controls a ratio of a change of the amplitude based on a control signal; and an attenuator that outputs an output signal obtained by attenuating an output from the amplitude changer, the signal output control process including: a correspondence recording step that records a predetermined correspondence which is a correspondence between the value of the control signal and the value of the output signal when the input signal is at a predetermined frequency; a target value correcting step that corrects a target value of the output signal to a value of the output signal corresponding, in the predetermined correspondence, to a value of the control signal which brings the output signal to the target value according to the frequency of the input signal; and a control signal setting step that reads a value of the control signal corresponding, in the predetermined correspondence, to an output of the target value correcting step from the correspondence recording step, and sets the read value of the control signal to the value of the control signal.

The present invention is a computer-readable medium having a program of instructions for execution by the computer to perform a signal output control process of a signal output device having: an amplitude changer that changes an amplitude of an input signal, and controls a ratio of a change of the amplitude based on a control signal; and a discrete attenuator that outputs an output signal obtained by attenuating an output from the amplitude changer while discretely setting an amount of the attenuation, the signal output control process including: a measurement result changing step that changes a measurement result of the output signal; a correspondence recording step that records a predetermined correspondence which is a correspondence between the value of the control signal and the value of the output signal when the input signal is at a predetermined frequency; a measurement result correcting step that corrects a measurement result of the output signal changed by the measurement result changing step to a value of the output signal corresponding, in the predetermined correspondence, to a value of the control signal which brings the output signal to the changed measurement result according to the frequency of the input signal; a target value correcting step that corrects a target value of the output signal to a value of the output signal corresponding, in the predetermined correspondence, to a value of the control signal which brings the output signal to the target value according to the frequency of the input signal; a control signal setting step that reads the value of the control signal corresponding, in the predetermined correspondence, to a sum of a difference between an output from the target value correcting step and the output from the measurement result correcting step, and the output from the target value correcting step from the correspondence recording step, and sets the read value of the control signal to the value of the control signal; an attenuation setting step that sets the amount of the attenuation according to the frequency of the input signal; and a change setting step that sets an amount of the change provided by the measurement result changing step based on a difference between an ideal amount of the attenuation which is the amount of the attenuation proper for the output signal to be close to the target value and the amount of the attenuation set by the discrete attenuator.

BEST MODE FOR CARRYING OUT THE INVENTION

A description will now be given of embodiments of the present invention with reference to drawings.

First Embodiment

Figure 1:
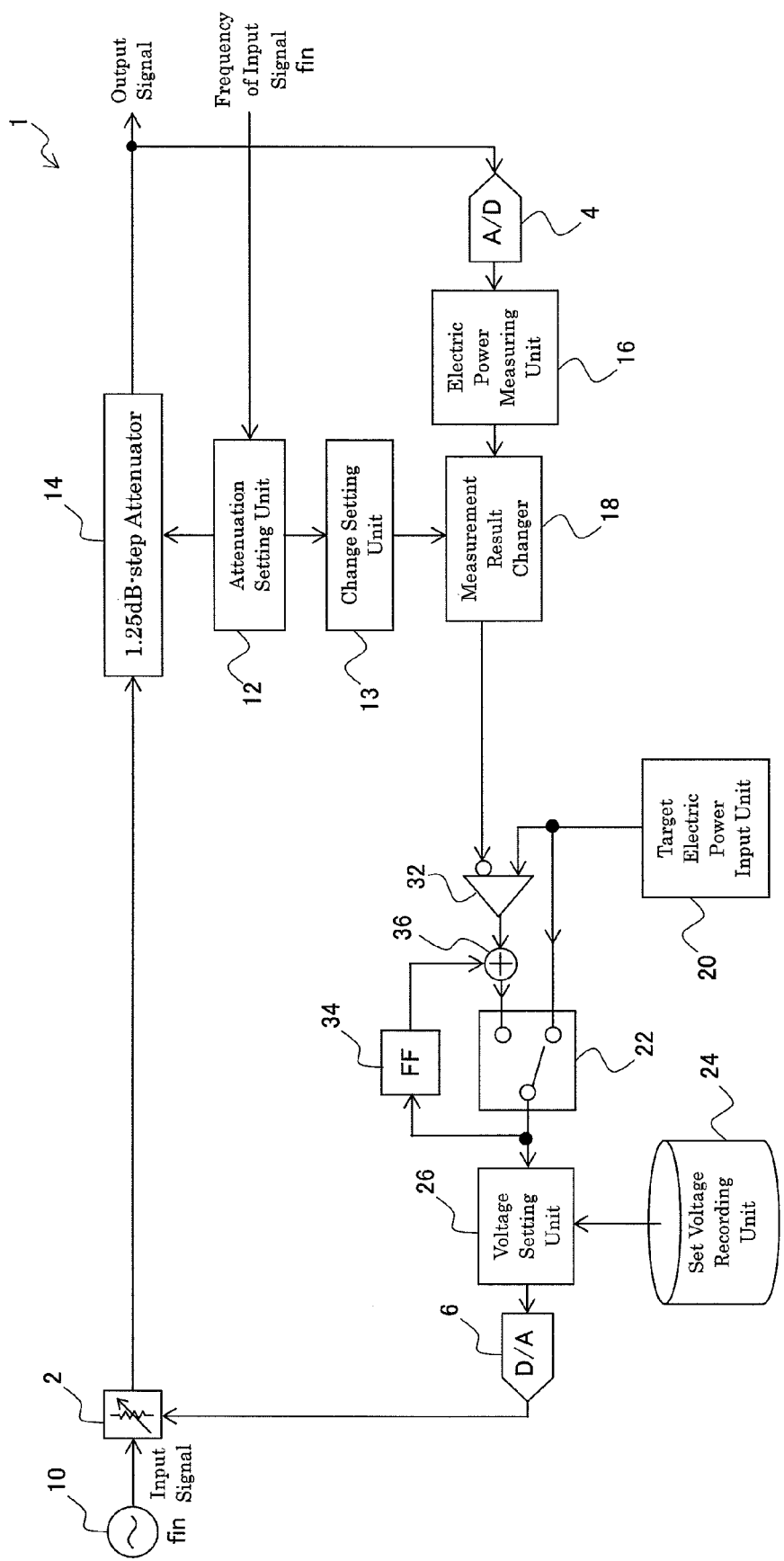
FIG. 1 is a block diagram showing a configuration of an output control system 1 according to a first embodiment of the present invention.

FIG. 1 is a block diagram showing a configuration of an output control system 1 according to a first embodiment of the present invention. The output control system 1 includes a variable-gain attenuator (amplitude changer) 2, an A/D converter 4, a D/A converter 6, an input signal source 10, an attenuation setting unit 12, a change setting unit 13, a 1.25 dB-step attenuator (discrete attenuator) 14, an electric power measuring unit 16, a measurement result changer 18, a target electric power input unit 20, a switch 22, a set voltage recording unit (correspondence recording unit) 24, a voltage setting unit (control signal setting unit) 26, a subtractor 32, a flip-flop 34 and an adder 36.

The variable-gain attenuator (amplitude changer) 2 receives an analog input signal (such as an AC voltage), changes the amplitude of the input signal, and outputs the signal the amplitude of which has been changed. It should be noted that a ratio of change of the amplitude (=[amplitude of the output signal]/[amplitude of the input signal]) of the variable-gain attenuator 2 is controlled based on a value (voltage) of a control signal fed to the variable-gain attenuator 2. Since the variable-gain attenuator 2 is an attenuator, the ratio of the change is less than one.

Though the embodiment of the present invention employs the variable-gain attenuator 2, a variable-gain amplifier (ratio of change>1) may be employed.

The 1.25 dB-step attenuator (discrete attenuator) 14 attenuates the output from the variable-gain attenuator 2, and outputs an output signal. It should be noted that how much the input signal is attenuated by the 1.25 dB-step attenuator (attenuation) is discretely set.

The input signal source 10 outputs the input signal.

The attenuation setting unit 12 sets the attenuation carried out by the 1.25 dB-step attenuator 14 according to the frequency fin of the input signal.

Figure 2:
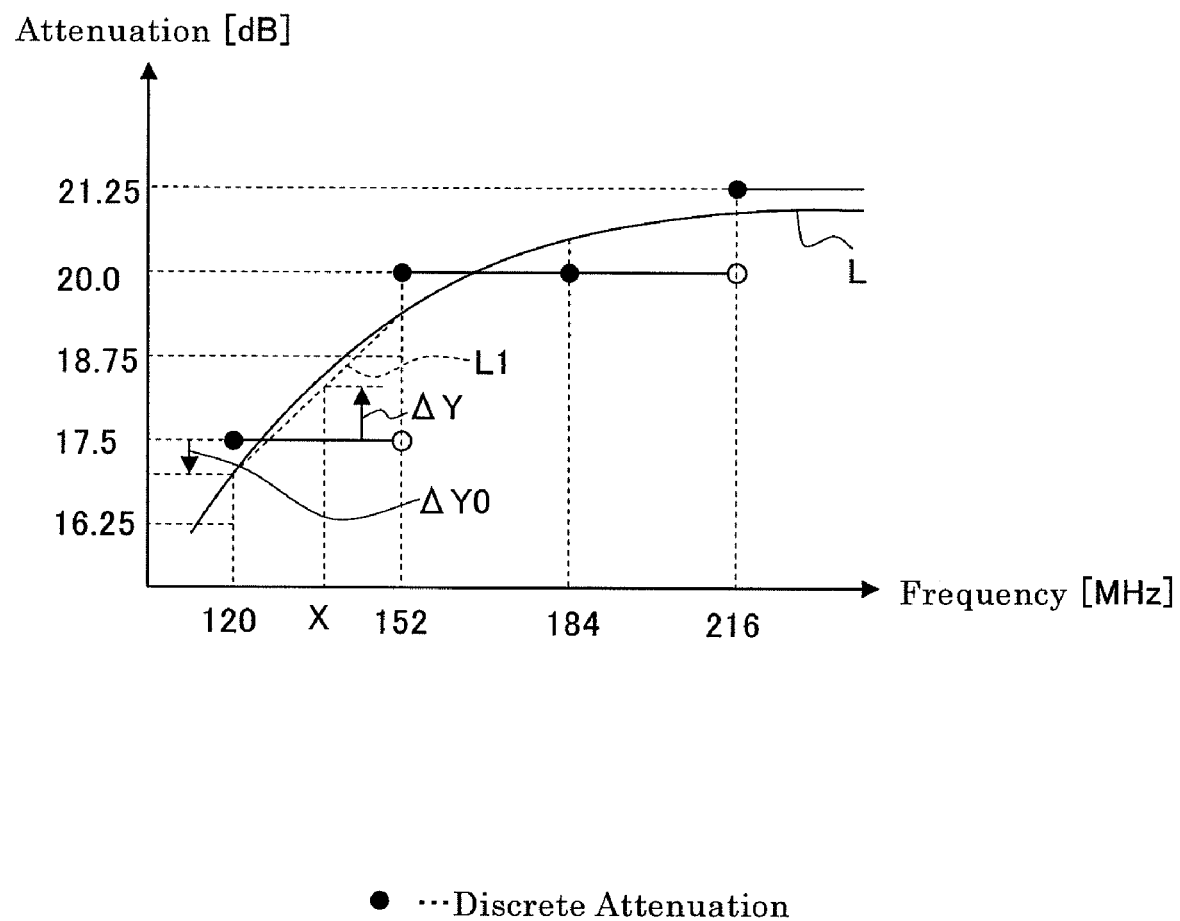
FIG. 2 shows the attenuation provided by the 1.25 dB-step attenuator 14 and the change provided by the measurement result changer 18.

FIG. 2 shows the attenuation provided by the 1.25 dB-step attenuator 14 and the change provided by the measurement result changer 18. It should be noted that, the attenuation provided by the 1.25 dB-step attenuator 14 is referred to as discrete attenuation in FIG. 2.

With reference to FIG. 2, a curve L shows a correspondence between the attenuation of the 1.25 dB-step attenuator 14 and the frequency of the input signal which properly brings the electric power of the output signal close to a target value (for example, a correspondence in which the lower the frequency of the input signal is, the smaller the electric power of the input signal is). The attenuation represented by the curve L is referred to as an ideal attenuation.

The attenuation setting unit 12 divides the frequency fin of the input signal into predetermined ranges, and causes the attenuation to be constant in the respective predetermined ranges. Moreover, it is assumed that the attenuations can be set only in increment of 1.25 dB. For example, the attenuation can only take any values of 16.25 dB, 17.5 dB, 18.75 dB, 20 dB and 21.25 dB.

For example, with respect to a range equal to or more than 120 MHz and less than 152 MHz of the frequency of the input signal, at 120 MHz (lowest frequency) of the left end of the range, an attenuation of 17.5 dB closest to the curve L is set to an attenuation of this range. In other words, when the frequency of the input signal is equal to or more than 120 MHz and less than 152 MHz, the attenuation setting unit 12 sets the attenuation so that the 1.25 dB-step attenuator 14 attenuates the electric power of the input signal by 17.5 dB.

It should be noted that, with respect to a range equal to or more than 152 MHz and less than 184 MHz of the frequency of the input signal, at 152 MHz (lowest frequency) of the left end of the range, an attenuation of 20 dB closest to the curve L is set to an attenuation of this range. With respect to a range equal to or more than 184 MHz and less than 216 MHz of the frequency of the input signal, at 184 MHz (lowest frequency) of the left end of the range, an attenuation of 20 dB closest to the curve L is set to an attenuation of this range.

The description has been given of the case in which an attenuation closest to the curve L at the left end (lowest frequency) of the range is set to the attenuation in this range. However, the frequency at which the attenuation closest to the curve L is set to the attenuation of a range is not limited to the one at the left end of the range, but may be any frequency in the range (for example, at the right end (highest frequency) or at the center of the range).

The A/D converter 4 receives the output signal from the 1.25 dB-step attenuator 14, digitizes the output signal, and supplies the electric power measuring unit 16 with the digitized output signal.

The electric power measuring unit 16 receives the digitized output signal from the A/D converter 4, and measures the electric power.

The measurement result changer 18 changes a result of the measurement of the output signal.

The change setting unit 13 sets a change caused by the measurement result changer 18 based on a difference between the ideal attenuation (curve L) and the attenuation set to the 1.25 dB-step attenuator 14.

With reference to FIG. 2, a change is to be set when the frequency of the input signal is a certain value X [MHz] in the range equal to or more than 120 MHz and less than 152 MHz.

On this occasion, it is assumed that the ideal attenuation changes in proportion to the change in the frequency of the input signal in the range of the frequency of the input signal equal to or more than 120 MHz and less than 152 MHz, and an attenuation approximating the ideal attenuation is referred to as an approximated ideal attenuation. The approximated ideal attenuation is represented by a line L1. In other words, a line connecting a point of the ideal attenuation (curve L) at the frequency of 120 MHz of the input signal and a point of the ideal attenuation (curve L) at the frequency of 152 MHz of the input signal is the approximated ideal attenuation (line L1).

The change setting unit 13 sets the change based on the difference between the ideal attenuation (curve L) and the attenuation of 17.5 dB set to the 1.25 dB-step attenuator 14. In other words, the change setting unit 13 approximates the ideal attenuation (curve L) to the approximated ideal attenuation (line L1), and sets the difference between the approximated ideal attenuation (line L1) and the attenuation of 17.5 dB set to the 1.25 dB-step attenuator 14 to the change.

The change $\Delta Y$ is represented as $a(X-120)-\Delta Y0$ where "a" denotes the gradient of the approximated ideal attenuation (line L1) and $\Delta Y0$ (>0) is a difference between the ideal attenuation and 17.5 dB when the frequency of the input signal is 120 MHz. In other words, the change setting unit 13 carries out the setting such that the measurement result changer 18 attenuates the measurement result of the output signal by the change $\Delta Y$.

The target electric power input unit 20 is used to enter a target electric power P0 which is a target value of the electric power of the output signal.

Figure 4:
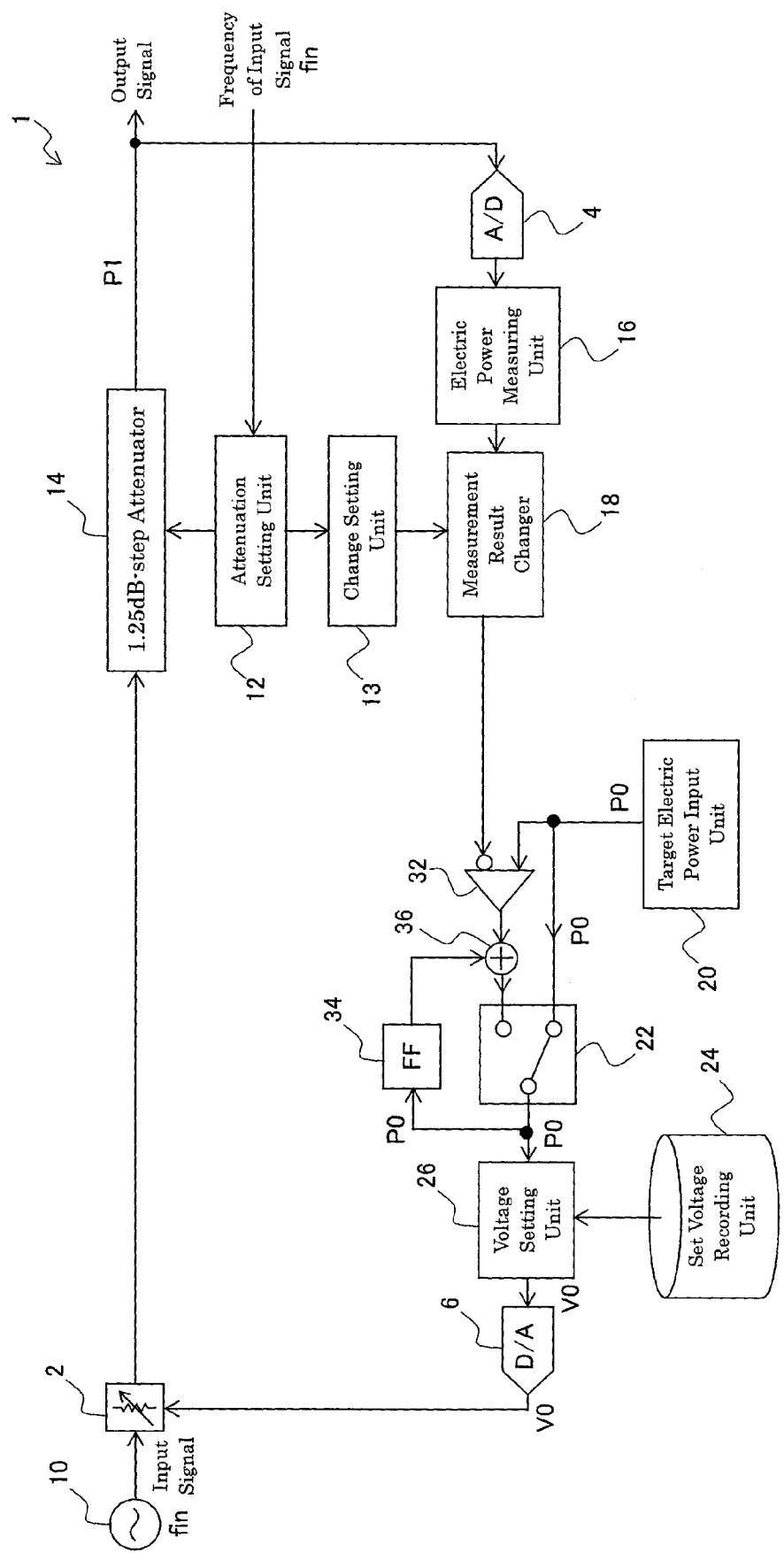
FIG. 4 describes an operation of the output control system 1 while the output from the target electric power input unit 20 is fed to the voltage setting unit 26 according to the first embodiment.
Figure 5:
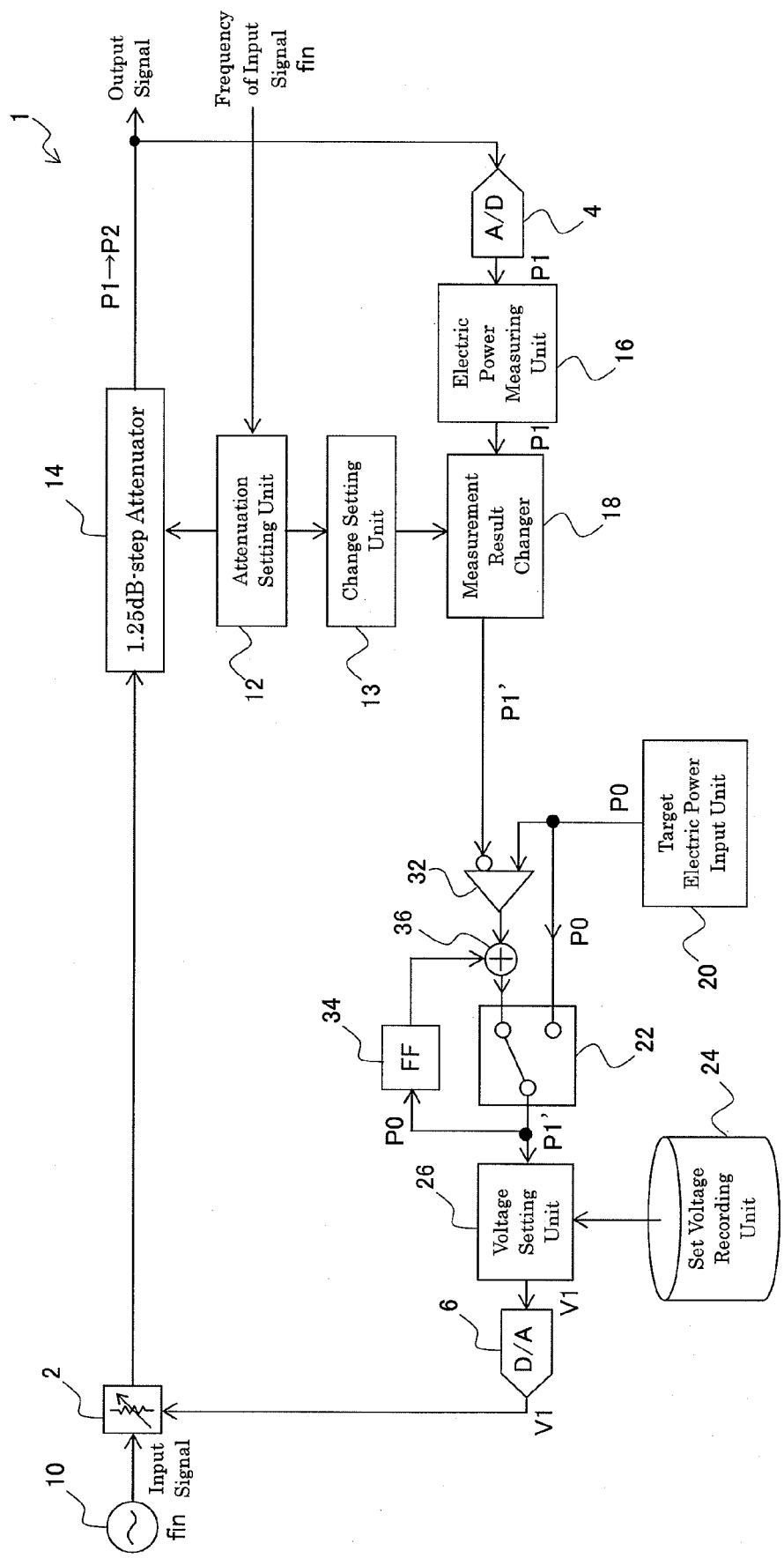
FIG. 5 describes an operation of the output control system 1 while the output from the adder 36 is fed to the voltage setting unit 26 according to the first embodiment.

The switch 22 realizes (a) a state in which an output from the target electric power input unit 20 is fed to the voltage setting unit 26 (refer to FIG. 4), or (b) a state in which an output from the adder 36 is fed to the voltage setting unit 26 (refer to FIG. 5).

The set voltage recording unit (correspondence recording unit) 24 records a predetermined correspondence which is a correspondence between the value (voltage) of the control signal and the value (electric power) of the output signal when the input signal has a predetermined frequency (such as 2 GHz). It should be noted that the set voltage recording unit 24 may record the predetermined correspondence as a function (such as quartic function) of the value (electric power) of the output signal.

Figure 3:
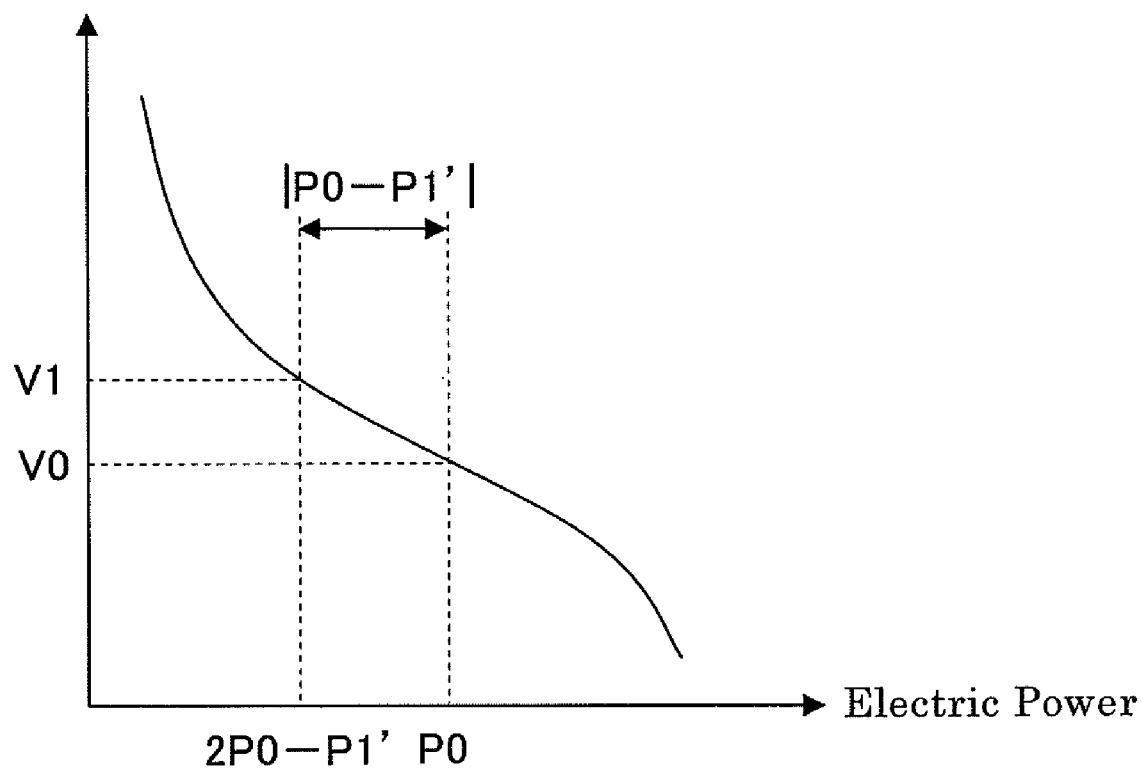
FIG. 3 shows the predetermined correspondence.

FIG. 3 shows the predetermined correspondence.

The voltage setting unit (control signal setting unit) 26 reads, from the correspondence recording unit 24, a value of the control signal corresponding to the output from the target electric power input unit 20 (refer to FIG. 4) or the output from the adder 36 (refer to FIG. 5) in the predetermined correspondence, and sets the read value as the value (voltage) of the control signal.

With reference to FIG. 3, when the output P0 of the target electric power input unit 20 is fed to the voltage setting unit 26, the value (set voltage) of the control signal is set to V0.

The subtractor 32 subtracts the output from the measurement result changer 18 from the output from the target electric power input unit 20.

The flip-flop 34 holds the signal fed to the voltage setting unit 26. The flip-flop 34 holds the output from the target electric power input unit 20, for example.

The adder 36 adds an output from the subtractor 32 to an output from the flip-flop 34. The voltage setting unit 26 sets the value of the control signal based on the output from the adder 36 (obtained by adding the output from the flip-flop 34 to the difference obtained by subtracting the output from the measurement result changer 18 from the output from the target electric power input unit 20). Therefore, it is considered that the voltage setting unit 26 sets the control signal based on the output from the measurement result changer 18 and the target value of the output signal (output from the target electric power input unit 20).

The D/A converter 6 receives the control signal from the voltage setting unit 26, converts the control signal into an analog signal, and feeds the analog signal to the variable-gain attenuator 2.

A description will now be given of an operation of the first embodiment.

First, the output control system 1 is in a state shown in FIG. 4.

FIG. 4 describes an operation of the output control system 1 while the output from the target electric power input unit 20 is fed to the voltage setting unit 26 according to the first embodiment.

First, the target electric power P0, which is the target value of the electric power of the output signal, is fed from the target electric power input unit 20 to the voltage setting unit 26 via the switch 22. It should be noted that the flip-flop 34 receives and holds the target electric power P0.

The voltage setting unit 26 reads the value V0 of the control signal corresponding to the target electric power P0, sets the value (voltage) of the control signal to V0, and outputs a control signal having the voltage of V0. The control signal output from the voltage setting unit 26 is fed to the D/A converter 6. The D/A converter 6 converts the control signal into the analog signal, and feeds the analog signal to the variable-gain attenuator 2. When the control signal (voltage V0) is fed to the variable-gain attenuator 2, with reference to FIG. 3, the electric power of the output signal, which is the output from the variable-gain attenuator 2, and is then attenuated by the 1.25 dB-step attenuator 14, should be the target electric power P0. However, the actual electric power P1 is not P0.

Then, the output control system 1 takes a state shown in FIG. 5.

FIG. 5 describes an operation of the output control system 1 while the output from the adder 36 is fed to the voltage setting unit 26 according to the first embodiment.

The output signal output from the 1.25 dB-step attenuator 14 is digitized by the A/D converter 4, and is fed to the electric power measuring unit 16. The electric power measuring unit 16 measures the electric power and obtains the electric power P1.

The electric power P1 is changed into an electric power P1' (=P1−ΔY) by the measurement result changer 18. The electric power P1' is obtained by further attenuating the electric power P1 in the example shown in FIG. 2. The electric power P1' is closer to the value obtained by attenuating the output of the variable-gain attenuator 2 by the ideal attenuation (curve L) than the electric power P1. Thus, the electric power of the output signal is close to the target value, which is preferable.

The subtractor 32 outputs P0−P1'. The flip-flop 34 holds P0. Thus, the adder 36 outputs P0−P1'+P0=2P0−P1'.

For example, when P1'>P0, 2P0−P1'<P0. In this case, the measurement result is too large, and the electric power of the output signal is thus to be reduced by increasing the voltage (value of the control signal).

With reference to FIG. 3, the voltage setting unit 26 reads the value V1 of the control signal corresponding to 2P0−P1' from the set voltage recording unit 24, and outputs the control signal having the voltage V1. Since the voltage of the control signal increases, the electric power of the output signal decreases.

The control signal output from the voltage setting unit 26 is fed to the D/A converter 6. The D/A converter 6 converts the control signal into the analog signal, and feeds the analog signal to the variable-gain attenuator 2. When the control signal (value V1) is fed to the variable-gain attenuator 2, the electric power of the output signal becomes P2.

When the output control system 1 stays in the state shown in FIG. 5, the output control system 1 continues the operation similar to the operation described with reference to FIG. 5.

According to the first embodiment, since the measurement result of the output signal is changed by the measurement result changer 18 to become close to a preferable value which brings the measurement result of the output signal close to the target value, the measurement result of the output signal tends to become close to the target value.

Second Embodiment

Figure 6:
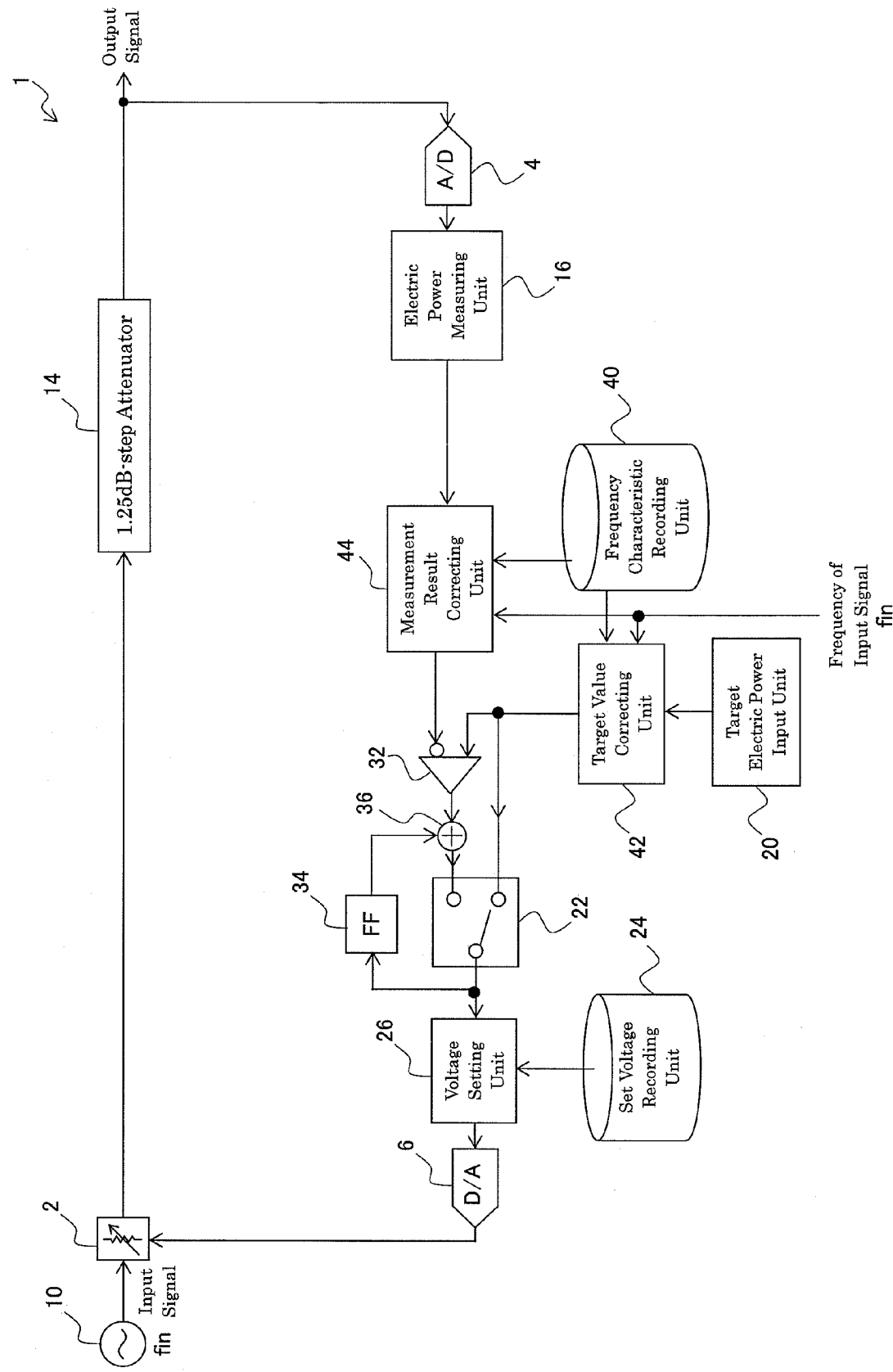
FIG. 6 is a block diagram showing a configuration of the output control system 1 according to a second embodiment of the present invention.

FIG. 6 is a block diagram showing a configuration of the output control system 1 according to a second embodiment of the present invention. The output control system 1 includes the variable-gain attenuator (amplitude changer) 2, the A/D converter 4, the D/A converter 6, the input signal source 10, the 1.25 dB-step attenuator 14, the electric power measuring unit 16, the target electric power input unit 20, the switch 22, the set voltage recording unit (correspondence recording unit) 24, the voltage setting unit (control signal setting unit) 26, the subtractor 32, the flip-flop 34, the adder 36, a frequency characteristic recording unit 40, a target value correcting unit 42 and a measurement result correcting unit 44.

The variable-gain attenuator (amplitude changer) 2, the A/D converter 4, the D/A converter 6, the input signal source 10, the electric power measuring unit 16, the target electric power input unit 20, the set voltage recording unit (correspondence recording unit) 24 and the voltage setting unit (control signal setting unit) 26 are the same as those of the first embodiment, and hence description thereof is omitted.

It should be noted that the voltage setting unit (control signal setting unit) 26 reads, from the correspondence recording unit 24, a value of the control signal corresponding to the output from the target value correcting unit 42 (refer to FIG. 8) or the output from the adder 36 (refer to FIG. 9) in a predetermined correspondence, and sets the read value as the value (voltage) of the control signal.

The 1.25 dB-step attenuator 14 attenuates the output from the variable-gain attenuator 2, and outputs the output signal. The attenuation caused by the 1.25 dB-step attenuator 14 may be set discretely, for example (refer to FIG. 2).

The target value correcting unit 42, according to the frequency fin of the input signal, corrects the target value of the output signal received from the target electric power input unit 20 to a value of the output signal corresponding, in the predetermined correspondence, to a value of the control signal which brings the output signal to the target value.

The measurement result correcting unit 44, according to the frequency fin of the input signal, corrects the measurement result of the output signal received from the electric power measuring unit 16 to a value of the output signal corresponding, in the predetermined correspondence, to a value of the control signal which brings the output signal to the measurement result.

It should be noted that the target value correcting unit 42 and the measurement result correcting unit 44 refer to records in the frequency characteristic recording unit 40, thereby correcting the target value of the output signal and the measurement result respectively. The frequency characteristic recording unit 40 records a correspondence between the target value of the output signal (before the correction) and target value of the output signal (after the correction), and a correspondence between the measurement result (before the correction) and the measurement result (after the correction).

Figure 7:
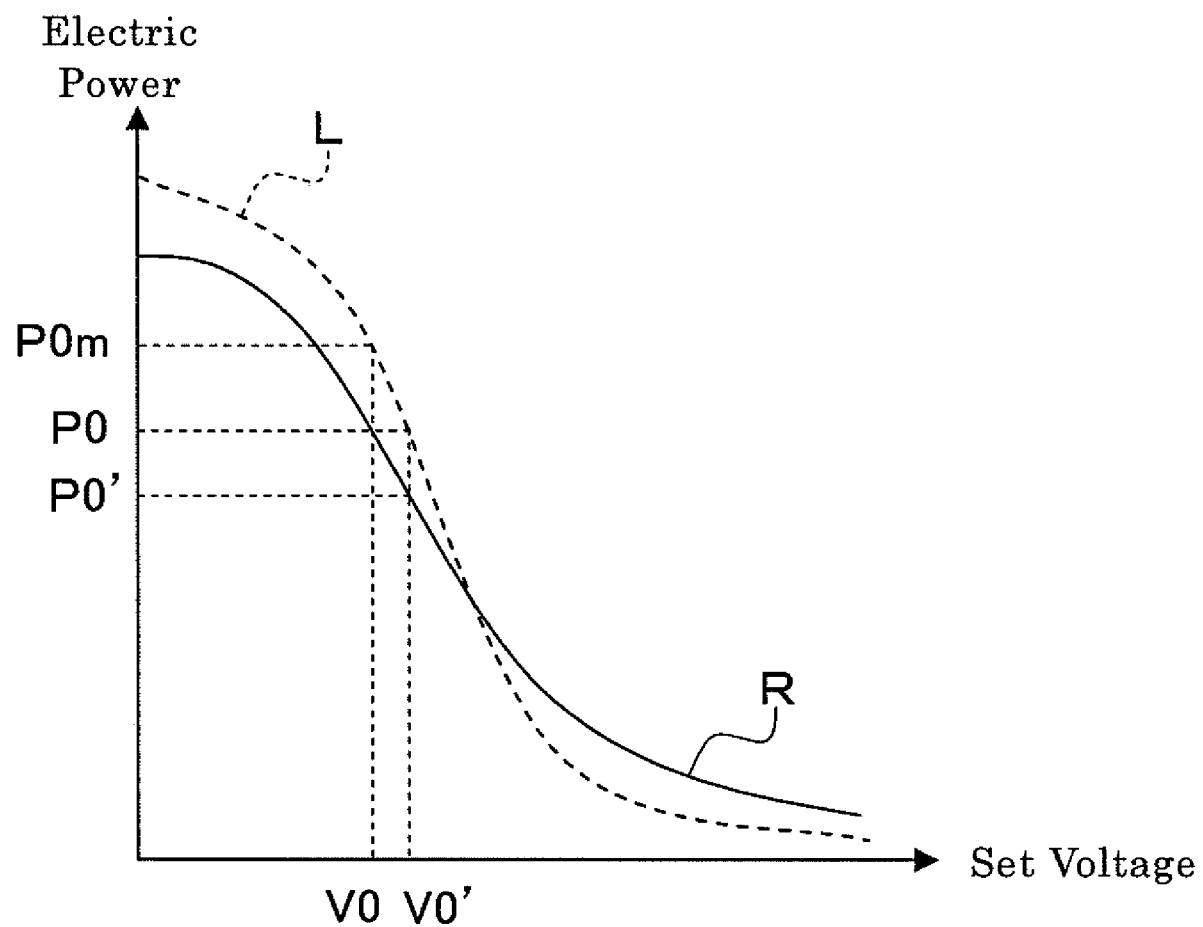
FIG. 7 describes a correction method of the target value of the output signal carried out by the target value correcting unit 42.

FIG. 7 describes a correction method of the target value of the output signal carried out by the target value correcting unit 42. In FIG. 7, a solid curve R represents a correspondence between the value (set voltage) of the control signal and the value (electric power) of the output signal when the frequency of the input signal is fin, which is not 2 GHz, and a dotted curve L shows a correspondence (predetermined correspondence) between the value (set voltage) of the control signal and the value (electric power) of the output signal when the frequency of the input signal is 2 GHz.

The target value correcting unit 42 receives the target value P0 of the output signal from the target electric power input unit 20. On this occasion, with reference to the curve R, the value of the control signal is to be V0. However, the set voltage recording unit (correspondence recording unit) 24 records the predetermined correspondence (curve L). Thus, when the target value P0 is fed to the voltage setting unit 26, referring to the curve L, the value of the control signal becomes V0' (>V0). As a result, the value (electric power) of the output signal becomes P0' (<P0).

Then, the target value correcting unit 42 corrects the target value P0 to a value P0m of the output signal corresponding, in the predetermined correspondence (curve L), to the value V0 (refer to curve R) of the control signal which brings the output signal to the target value P0. In other words, the target value correcting unit 42 receives the target value P0, and outputs the corrected target value P0m. The frequency characteristic recording unit 40 records the target value P0 and the corrected target value P0m corresponding to each other.

It should be noted that the measurement result correcting unit 44 similarly corrects the measurement result of the output signal.

The frequency characteristic recording unit 40 may record a difference between the target value of the output signal (before the correction) and the target value of the output signal (after the correction), and a difference between the measurement result (before the correction) and the measurement result (after the correction), or record these differences as a function (such as a quadratic function) of the target value of the output signal (before correction) and the measurement result (before correction) respectively. Based on these differences, the target value correcting unit 42 and the measurement result correcting unit 44 may carry out the corrections.

For example, when a correspondence of the target value (before correction) P0 of the output signal to a difference ΔP between the target value (before correction) of the output signal and the target value (after correction) of the output signal is recorded in the frequency characteristic recording unit 40, the target value correcting unit 42 corrects the target value P0 of the output signal to P0m (=P0+ΔP). The difference ΔP can be considered as the difference between the predetermined correspondence (curve L) and the correspondence (curve R) between the value of the control signal and the output signal at the set voltage V0 when the input signal is not at the predetermined frequency.

In this way, the target value correcting unit 42 may correct the target value based on the difference between the predetermined correspondence and the correspondence between the value of the control signal and the value of the output signal when the input signal is not at the predetermined frequency.

For example, when the correspondence of the measurement result (before correction) P0 of the output signal to a difference ΔP between the measurement result (before the correction) of the output signal and the measurement result (after the correction) of the output signal are recorded in the frequency characteristic recording unit 40, the measurement result correcting unit 44 corrects the measurement result P0 of the output signal to P0m (=P0+ΔP).

In this way, the measurement result correcting unit 44 may correct the measurement result based on the difference between the predetermined correspondence and the correspondence between the value of the control signal and the value of the output signal when the input signal is not at the predetermined frequency.

Figure 8:
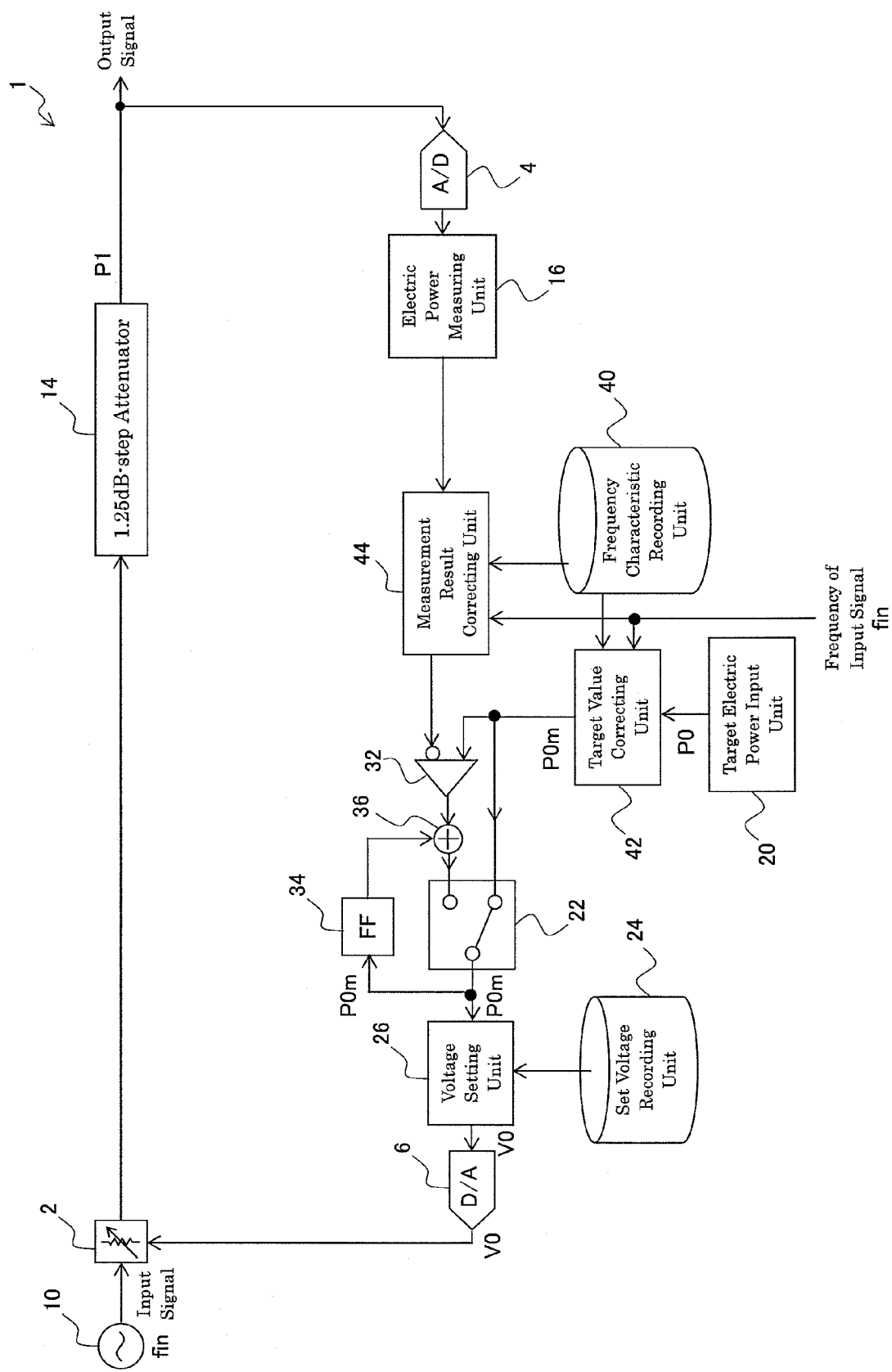
FIG. 8 describes an operation of the output control system 1 while the output from the target electric power input unit 20 is fed to the voltage setting unit 26 according to the second embodiment.
Figure 9:
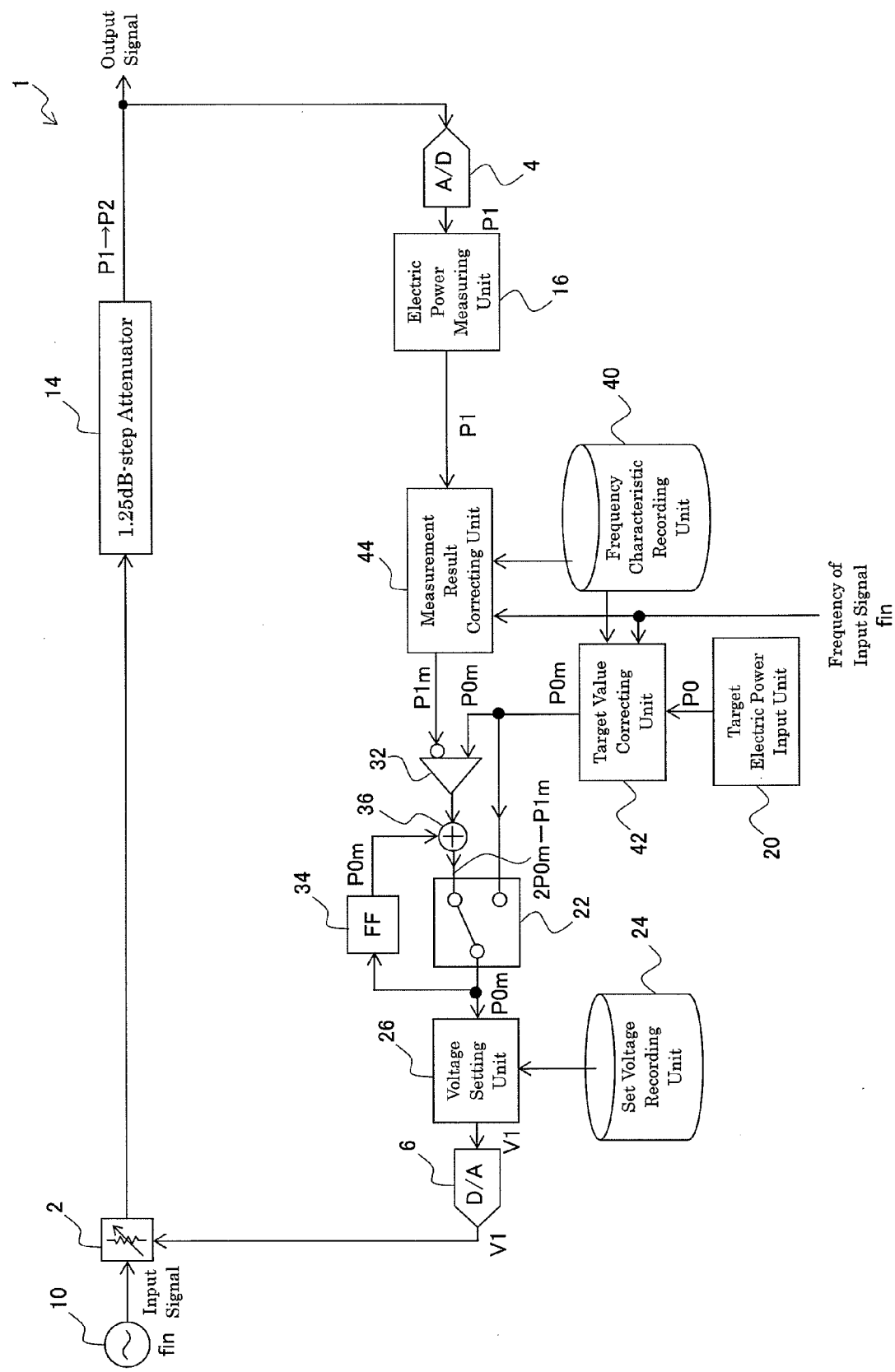
FIG. 9 describes an operation of the output control system 1 while the output from the adder 36 is fed to the voltage setting unit 26 according to the second embodiment.

The switch 22 realizes (a) a state in which the output from the target value correcting unit 42 is fed to the voltage setting unit 26 (refer to FIG. 8), or (b) a state in which the output from the adder 36 is fed to the voltage setting unit 26 (refer to FIG. 9).

The subtractor 32 subtracts the output from the measurement result correcting unit 44 from the output from the target value correcting unit 42.

The flip-flop 34 records the signal fed to the voltage setting unit 26. The flip-flop 34 records the output from the target value correcting unit 42, for example.

The adder 36 adds the output from the subtractor 32 to the output from the flip-flop 34.

A description will now be given of an operation of the second embodiment.

First, the output control system 1 is in a state shown in FIG. 8.

FIG. 8 describes an operation of the output control system 1 while the output from the target electric power input unit 20 is fed to the voltage setting unit 26 according to the second embodiment.

First, the target electric power input unit 20 feeds the target electric power P0 to the target value correcting unit 42. The target value correcting unit 42 corrects the target electric power P0 into P0m (refer to FIG. 7). The output P0m from the target value correcting unit 42 is fed to the voltage setting unit 26 via the switch 22. It should be noted that the flip-flop 34 receives and holds the corrected target electric power P0m.

The voltage setting unit 26 reads, from the set voltage recording unit (correspondence recording unit) 24, the value V0 (refer to FIG. 7) of the control signal corresponding to the corrected target electric power P0m (output from the target value correcting unit 42) in the predetermined correspondence (refer to the curve L in FIG. 7), sets the value V0 to the value (voltage) of the control signal, and outputs the control signal having the voltage V0.

The control signal output from the voltage setting unit 26 is fed to the D/A converter 6. The D/A converter 6 converts the control signal into the analog signal, and feeds the analog signal to the variable-gain attenuator 2. When the control signal (voltage V0) is fed to the variable-gain attenuator 2, with reference to FIG. 7, the electric power of the output signal, which is the output from the variable-gain attenuator 2, and is then attenuated by the 1.25 dB-step attenuator 14, should be the target electric power P0. However, the actual electric power P1 is not P0.

Then, the output control system 1 takes a state shown in FIG. 9.

FIG. 9 describes an operation of the output control system 1 while the output from the adder 36 is fed to the voltage setting unit 26 according to the second embodiment.

The output signal output from the 1.25 dB-step attenuator 14 is digitized by the A/D converter 4, and is fed to the electric power measuring unit 16. The electric power measuring unit 16 measures the electric power and obtains the electric power P1.

The electric power P1 is corrected by the measurement result correcting unit 44 into an electric power P1*m*.

The subtractor 32 outputs P0*m*−P1*m*. The flip-flop 34 holds P0*m*. Thus, the adder 36 outputs P0*m*−P1*m*+P0*m*=2P0*m*−P1*m*. In other words, after the measurement carried out by the electric power measuring unit 16, the adder 36 outputs 2P0*m*−P1*m*, which is obtained by adding the difference P0*m*−P1*m* (output from the subtractor 32) between the output P0*m* from the target value correcting unit 42 and the output P1*m* from the measurement result correcting unit 44 to the output P0*m* (output from the flip-flop 34) from the target value correcting unit 42.

For example, when P1*m*>P0*m*, 2P0*m*−P1*m*<P0*m*. In this case, the measurement result is too large, and the electric power of the output signal is thus to be reduced by increasing the voltage (value of the control signal).

The voltage setting unit 26 reads the value V1 of the control signal corresponding to 2P0*m*−P1*m* in the predetermined correspondence from the set voltage recording unit 24, and outputs the control signal having the voltage V1. Since the voltage of the control signal increases, the electric power of the output signal decreases.

The control signal output from the voltage setting unit 26 is fed to the D/A converter 6. The D/A converter 6 converts the control signal into the analog signal, and feeds the analog signal to the variable-gain attenuator 2. When the control signal (value V1) is fed to the variable-gain attenuator 2, the electric power of the output signal becomes P2.

When the output control system 1 stays in the state shown in FIG. 9, the output control system 1 continues the operation similar to the operation described with reference to FIG. 9.

According to the second embodiment, since the target value correcting unit 42 and the measurement result correcting unit 44 correct the target value of the output signal and the measurement result respectively, it is possible to bring the measurement result of the output signal close to the target value using the predetermined correspondence recorded in the set voltage recording unit 24 when the input signal is a predetermined frequency (such as 2 GHz) even if the input signal is not at the predetermined frequency.

Third Embodiment

The third embodiment corresponds to a combination of the first embodiment and the second embodiment.

Figure 10:
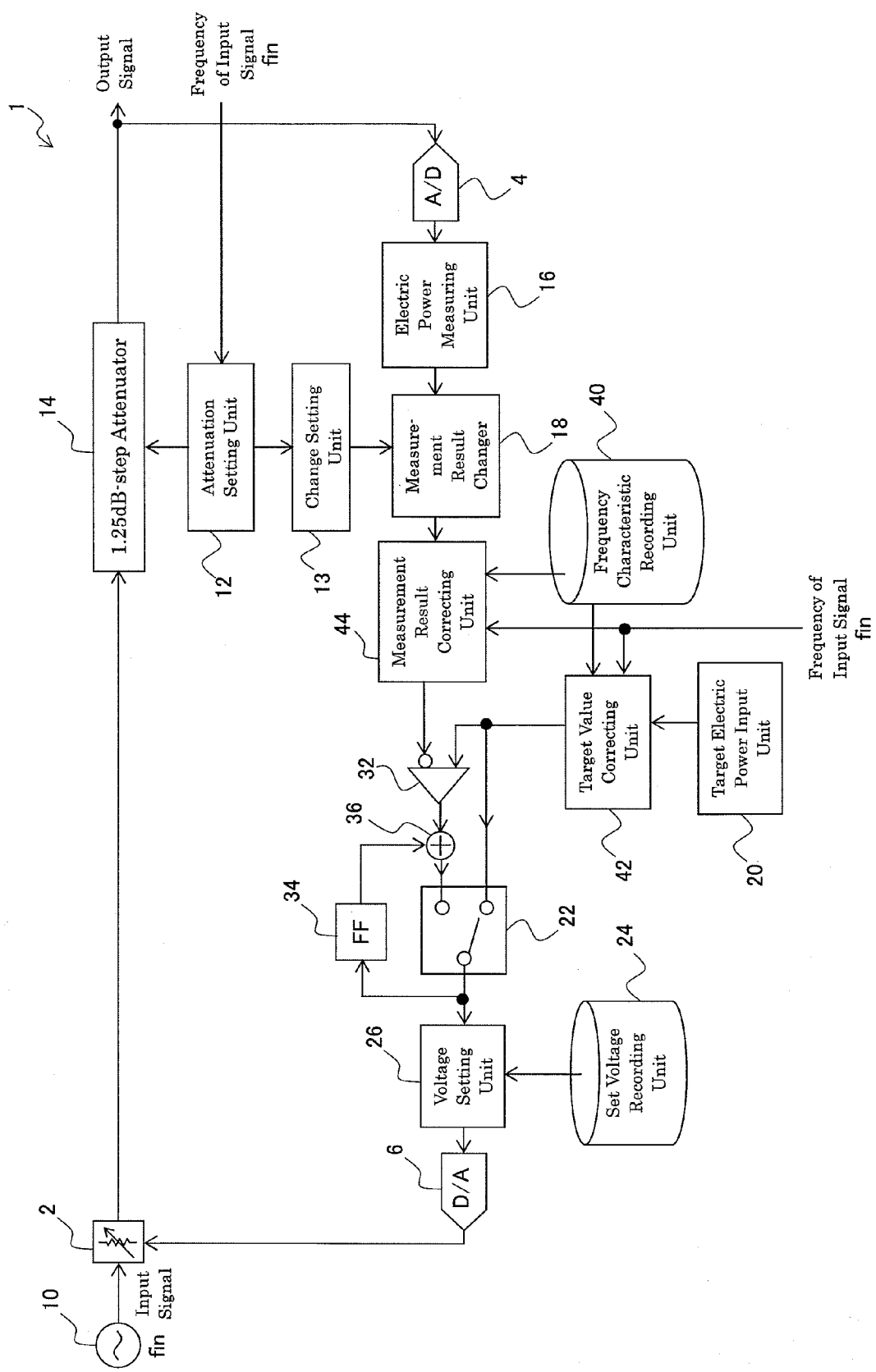
FIG. 10 is a block diagram showing a configuration of the output control system 1 according to the third embodiment of the present invention.

FIG. 10 is a block diagram showing a configuration of the output control system 1 according to the third embodiment of the present invention. The output control system 1 includes the variable-gain attenuator (amplitude changer) 2, the A/D converter 4, the D/A converter 6, the input signal source 10, the attenuation setting unit 12, the change setting unit 13, the 1.25 dB-step attenuator (discrete attenuator) 14, the electric power measuring unit 16, the measurement result changer 18, the target electric power input unit 20, the switch 22, the set voltage recording unit (correspondence recording unit) 24, the voltage setting unit (control signal setting unit) 26, the subtractor 32, the flip-flop 34, the adder 36, the frequency characteristic recording unit 40, the target value correcting unit 42 and the measurement result correcting unit 44.

The output control system 1 according to the third embodiment of the present invention corresponds to a configuration in which the measurement result correcting unit 44 according to the second embodiment is provided between the measurement result changer 18 and the subtractor 32 of the output control system 1 according to the first embodiment, the target value correcting unit 42 according to the second embodiment is provided between the target electric power input unit 20, and a portion of the switch 22 and the subtractor 32 according to the first embodiment, and the frequency characteristic recording unit 40 according to the second embodiment is further provided.

It should be noted that the measurement result correcting unit 44, according to the frequency fin of the input signal, corrects the measurement result of the changed output signal received from the measurement result changer 18 to a value of the output signal corresponding, in the predetermined correspondence, to a value of the control signal which brings the output signal to the changed measurement result.

An operation of the third embodiment is the same as that of the first and second embodiments.

According to the third embodiment, there are obtained effects as those of the first and second embodiments.

Moreover, the above-described embodiment may be realized in the following manner. A computer is provided with a CPU, a hard disk and a media (such as a floppy disk (registered trade mark) and a CD-ROM) reader, and the media reader is caused to read a medium recording a program realizing the above-described respective components, thereby installing the program on the hard disk. This method may also realize the above-described functions.

The invention claimed is:

1. A signal output device, comprising:
    an amplitude changer that changes an amplitude of an input signal, and controls a ratio of a change of the amplitude based on a control signal;
    a discrete attenuator that outputs an output signal obtained by attenuating an output from the amplitude changer while discretely setting an amount of the attenuation;
    a measurement result changer that changes a measurement result of the output signal;
    a control signal setter that sets the control signal based on an output from the measurement result changer and a target value of the output signal;
    an attenuation setter that sets the amount of the attenuation according to a frequency of the input signal; and
    a change setter that sets an amount of a change provided by the measurement result changer based on a difference between an ideal amount of the attenuation which is an amount of an attenuation proper for the output signal to be close to the target value and the amount of the attenuation set by the discrete attenuator.

2. The signal output device according to claim 1, wherein the amount of the attenuation set by the discrete attenuator is constant within a predetermined range of the frequency of the input signal.

3. The signal output device according to claim 1, wherein a difference between an approximated ideal amount of the attenuation which approximates the ideal amount of the attenuation and the amount of the attenuation set by the discrete attenuator is set to the amount of the change while it is assumed that the ideal amount of the attenuation varies in proportion to a change in the frequency of the input signal within a predetermined range of the frequency of the input signal.

4. A signal output device, comprising:
  an amplitude changer that changes an amplitude of an input signal, and controls a ratio of a change of the amplitude based on a control signal;
  an attenuator that outputs an output signal obtained by attenuating an output from the amplitude changer;
  a correspondence recorder that records a predetermined correspondence which is a correspondence between a value of the control signal and a value of the output signal when the input signal is at a predetermined frequency;
  a target value corrector that corrects a target value of the output signal to the value of the output signal corresponding, in the predetermined correspondence, to the value of the control signal which brings the output signal to the target value according to a frequency of the input signal; and
  a control signal setter that reads the value of the control signal corresponding, in the predetermined correspondence, to an output of the target value corrector from the correspondence recorder, and sets the read value of the control signal to the value of the control signal.

5. The signal output device according to claim 4, wherein the target value corrector corrects the target value based on a difference between the predetermined correspondence and a correspondence between the value of the control signal and the value of the output signal when the input signal is not at the predetermined frequency.

6. The signal output device according to claim 4, comprising:
  a measurement result corrector that corrects a measurement result of the output signal to the value of the output signal corresponding, in the predetermined correspondence, to the value of the control signal which brings the output signal to the measurement result according to the frequency of the input signal,
  wherein the control signal setter reads the value of the control signal corresponding, in the predetermined correspondence, to a sum of a difference between the output from the target value corrector and an output from the measurement result corrector, and the output from the target value corrector from the correspondence recorder after the output signal is measured, and sets the read value of the control signal to the value of the control signal.

7. The signal output device according to claim 6, wherein the measurement result corrector corrects the measurement result based on a difference between the predetermined correspondence and a correspondence between the value of the control signal and the value of the output signal when the input signal is not at the predetermined frequency.

8. A signal output device, comprising:
  an amplitude changer that changes an amplitude of an input signal, and controls a ratio of a change of the amplitude based on a control signal;
  a discrete attenuator that outputs an output signal obtained by attenuating an output from the amplitude change while discretely setting an amount of the attenuation;
  a measurement result changer that changes a measurement result of the output signal;
  a correspondence recorder that records a predetermined correspondence which is a correspondence between a value of the control signal and a value of the output signal when the input signal is at a predetermined frequency;
  a measurement result corrector that corrects a measurement result of the output signal changed by the measurement result changer to the value of the output signal corresponding, in the predetermined correspondence, to the value of the control signal which brings the output signal to the changed measurement result according to a frequency of the input signal;
  a target value corrector that corrects a target value of the output signal to the value of the output signal corresponding, in the predetermined correspondence, to the value of the control signal which brings the output signal to the target value according to the frequency of the input signal;
  a control signal setter that reads the value of the control signal corresponding, in the predetermined correspondence, to a sum of a difference between an output from the target value corrector and an output from the measurement result corrector, and the output from the target value corrector from the correspondence recorder, and sets the read value of the control signal to the value of the control signal;
  an attenuation setter that sets the amount of the attenuation according to the frequency of the input signal; and
  a change setter that sets an amount of a change provided by the measurement result changer based on a difference between an ideal amount of the attenuation which an amount of an attenuation proper for the output signal to be close to the target value and the amount of the attenuation set by the discrete attenuator.

9. A signal output control method of a signal output device, the signal output device including:
  an amplitude changer that changes an amplitude of an input signal, and controls a ratio of a change of the amplitude based on a control signal; and
  a discrete attenuator that outputs an output signal obtained by attenuating an output from the amplitude changer while discretely setting an amount of an attenuation,
  the signal output control method comprising:
    changing a measurement result of the output signal;
    setting the control signal based on an output from the changing the measurement result and a target value of the output signal;
    setting the amount of the attenuation according to a frequency of the input signal; and
    setting an amount of a change provided by the changing the measurement result based on a difference between an ideal amount of the attenuation which is an amount of an attenuation proper for the output signal to be close to the target value and the amount of the attenuation set by the discrete attenuator.

10. A signal output control method of a signal output device, the signal output device including:
  an amplitude changer that changes an amplitude of an input signal, and controls a ratio of a change of the amplitude based on a control signal; and
  an attenuator that outputs an output signal obtained by attenuating an output from the amplitude changer,
  the signal output control method comprising:
    recording a predetermined correspondence which is a correspondence between a value of the control signal and a value of the output signal when the input signal is at a predetermined frequency;
    correcting a target value of the output signal to the value of the output signal corresponding, in the predetermined correspondence, to the value of the control signal which brings the output signal to the target value according to a frequency of the input signal; and reading the value of the control signal corresponding, in the predetermined correspondence, to an output of the correcting the target value from the recording the predetermined correspondence, and setting the read value of the control signal to the value of the control signal.

11. A signal output control method of a signal output device, the signal output device including:

an amplitude changer that changes an amplitude of an input signal, and controls a ratio of a change of the amplitude based on a control signal; and a discrete attenuator that outputs an output signal obtained by attenuating an output from the amplitude changer while discretely setting an amount of an attenuation, the signal output control method comprising:

changing a measurement result of the output signal;

recording a predetermined correspondence which is a correspondence between a value of the control signal and a value of the output signal when the input signal is at a predetermined frequency;

correcting a measurement result of the output signal changed by the changing the measurement result to the value of the output signal corresponding, in the predetermined correspondence, to the value of the control signal which brings the output signal to the changed measurement result according to a frequency of the input signal;

correcting a target value of the output signal to the value of the output signal corresponding, in the predetermined correspondence, to the value of the control signal which brings the output signal to the target value according to the frequency of the input signal;

reading the value of the control signal corresponding, in the predetermined correspondence, to a sum of a difference between an output from the correcting the target value and an output from the correcting the measurement result, and the output from the correcting the target value from the recording the predetermined correspondence, and setting the read value of the control signal to the value of the control signal;

setting the amount of the attenuation according to the frequency of the input signal; and setting an amount of a change provided by the changing the measurement result based on a difference between an ideal amount of the attenuation which is an amount of an attenuation proper for the output signal to be close to the target value and the amount of the attenuation set by the discrete attenuator.

12. A non-transitory computer-readable medium including a program of instructions for execution by a computer to perform a signal output control process of a signal output device, the signal output device including:

an amplitude changer that changes an amplitude of an input signal, and controls a ratio of a change of the amplitude based on a control signal; and a discrete attenuator that outputs an output signal obtained by attenuating an output from the amplitude changer while discretely setting an amount of an attenuation, the signal output control process comprising:

changing a measurement result of the output signal;

setting the control signal based on an output from the changing the measurement result and a target value of the output signal;

setting the amount of the attenuation according to a frequency of the input signal; and setting an amount of a change provided by the changing the measurement result based on a difference between an ideal amount of the attenuation which is an amount of an attenuation proper for the output signal to be close to the target value and the amount of the attenuation set by the discrete attenuator.

13. A non-transitory computer-readable medium having a program of instructions for execution by a computer to perform a signal output control process of a signal output device, the signal output device including:

an amplitude changer that changes an amplitude of an input signal, and controls a ratio of a change of the amplitude based on a control signal; and an attenuator that outputs an output signal obtained by attenuating an output from the amplitude changer, the signal output control process comprising:

recording a predetermined correspondence which is a correspondence between a value of the control signal and a value of the output signal when the input signal is at a predetermined frequency;

correcting a target value of the output signal to the value of the output signal corresponding, in the predetermined correspondence, to the value of the control signal which bring the output signal to the target value according to a frequency of the input signal; and reading the value of the control signal corresponding, in the predetermined correspondence, to an output of the correcting the target value from the recording the predetermined correspondence, and setting the read value of the control signal to the value of the control signal.

14. A non-transitory computer-readable medium having a program of instructions for execution by a computer to perform a signal output control process of a signal output device, the signal output device including:

an amplitude changer that changes an amplitude of an input signal, and controls a ratio of a change of the amplitude based on a control signal; and a discrete attenuator that outputs an output signal obtained by attenuating an output from the amplitude changer while discretely setting an amount of an attenuation, the signal output control process comprising:

changing a measurement result of the output signal;

recording a predetermined correspondence which is a correspondence between a value of the control signal and a value of the output signal when the input signal is at a predetermined frequency;

correcting a measurement result of the output signal changed by the changing the measurement result to the value of the output signal corresponding, in the predetermined correspondence, to the value of the control signal which brings the output signal to the changed measurement result according to a frequency of the input signal;

correcting a target value of the output signal to the value of the output signal corresponding, in the predetermined correspondence, to the value of the control signal which brings the output signal to the target value according to the frequency of the input signal;

reading the value of the control signal corresponding, in the predetermined correspondence, to a sum of a difference between an output from the correcting the target value and an output from the correcting the measurement result, and the output from the correcting the target value from the recording the predetermined correspondence, and setting the read value of the control signal to the value of the control signal;

setting the amount of the attenuation according to the frequency of the input signal; and setting an amount of a change provided by the changing the measurement result based on a difference between an ideal amount of the attenuation which is an amount of an attenuation proper for the output signal to be close to the target value and the amount of the attenuation set by the discrete attenuator.

* * * * *